United States Patent
Choi et al.

[11] Patent Number: 6,081,156
[45] Date of Patent: Jun. 27, 2000

[54] METHOD AND APPARATUS FOR AMPLIFYING FEEDFORWARD LINEAR POWER USING PILOT TONE HOPPING

[75] Inventors: Myung-gu Choi, Seoul; Yong-chae Jeong, Anyang; Ik-hee Park, Seoul, all of Rep. of Korea

[73] Assignee: Samsung Electronics Co., Ltd., Rep. of Korea

[21] Appl. No.: 09/220,406

[22] Filed: Dec. 24, 1998

[30] Foreign Application Priority Data

Dec. 26, 1997 [KR] Rep. of Korea ............ 97-74594

[51] Int. Cl.[7] ............... H03F 3/66; H03F 1/26; H03F 1/00; H04B 1/10; H04K 1/02
[52] U.S. Cl. .............. 330/52; 330/149; 330/151; 455/63; 375/296
[58] Field of Search .............. 330/52, 149, 151; 455/63; 375/296

[56] References Cited

U.S. PATENT DOCUMENTS

| | | | |
|---|---|---|---|
| 4,802,191 | 1/1989 | McGeehan et al. | 375/43 |
| 5,166,634 | 11/1992 | Narahashi et al. | 330/151 |
| 5,815,036 | 9/1998 | Yoshikawa et al. | 330/52 |
| 5,877,653 | 3/1999 | Kim et al. | 330/149 |

Primary Examiner—Robert Pascal
Assistant Examiner—Patricia Nguyen
Attorney, Agent, or Firm—Dilworth & Barrese

[57] ABSTRACT

A method and apparatus for amplifying a feedforward linear power using a pilot tone hopping are disclosed. The method in a feedforward linear power amplifier system first determines an operating frequency signal for amplification from a radio frequency (RF) signal applied to the linear amplifier system. A pilot frequency signal is determined from the previously determined operating frequency signal, and the decided pilot frequency signal is hopped into an upper sideband or lower sideband of the operational frequency bandwidth of the applied RF signal and the determined pilot frequency signal is output to an input port of a main amplifier. One typical advantage of the method is that distortion component suppression characteristics in the wide operating frequency bandwidth are obtained by only one pilot signal generator and use of a control/detect device leads to simplicity of the circuit.

16 Claims, 5 Drawing Sheets

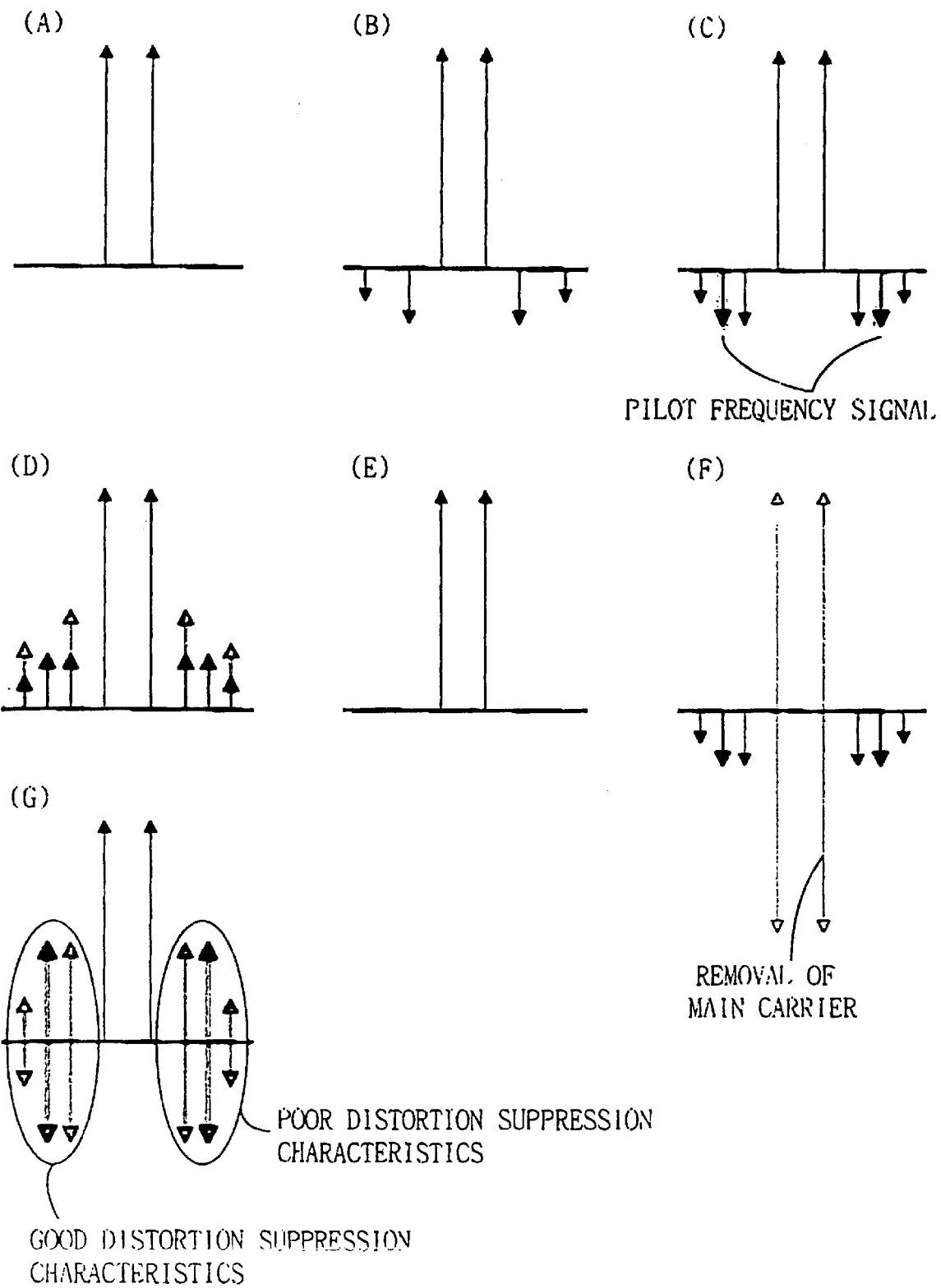

METHOD AND APPARATUS FOR AMPLIFYING FEEDFORWARD LINEAR POWER USING PILOT TONE HOPPING

FIELD OF THE INVENTION

The present invention relates to linear power amplifiers, and more particularly to a method and apparatus for feedforward linear power amplifying using pilot tone hopping.

DESCRIPTION OF THE RELATED ART

RF power amplifiers are used in a wide variety of communications and other electronic applications. These amplifiers are made up of one or more amplifier stages which are connected in parallel.

RF amplifiers are generally composed of elements having non-linear characteristics at high output levels. When one or more signals are applied to an RF amplifier, the non-linearity of the RF amplifier results in an undesirable intermodulation distortion component at the amplifier output. This distortion component causes interference and distortion at the frequency band of the amplifier. Since this distortion component is generated by the amplifier's non-linearity, a linear RF amplifier is needed to suppress these distortion components.

Three methods are widely known to make a linear power amplifier linear: one is a predistortion method using auxiliary sources that produce an auxiliary distortion signal at the input of the amplifier; another is a negative feedback method for suppressing the distortion component through feedback of the distortion component; and the other is a feedforward method that extracts only the distortion component, reverses the phase of the extracted distortion component and inputs the reversed phase distortion component into the amplifier again for suppression of the distortion component.

A feedforward linear power amplifier is disclosed in the U.S. Pat. No. 5,444,418 entitled "Method and Apparatus for Feedforward Power Amplifier". Referring to FIG. 1, a prior art feedforward linear power amplifier is illustrated in block diagram according to U.S. Pat. No. 5,444,418. As illustrated, a distortion minimization circuit has a first loop and an output combiner. The first loop has first and second signal paths, each having an amplifier and the output combiner coupling the first and second signal paths has an output signal path and an output dump load path.

A splitter 105 provides the input signal to both loops of the feedforward amplifier. In a first loop, the input signal is gain and phase adjusted through gain/phase controller 110, and further split via splitter 112 into two signal paths. The signal on the first main amplifier path from splitter 112 is gain and phase adjusted via gain/phase controller 114, amplified by the first main amplifier 116, and then injected with a pilot tone from pilot tone source 120 via coupler 118. The other path is delayed via delay 124. Both paths are then joined at a first interloop coupler 125. The first output path is delayed via delay 130, then fed into a first output combiner 135. The second output path is gain and phase adjusted by gain/phase controller 132 and amplified with amplifier 134, and combined with the first path in combiner 135. Finally, the first output path provides an output signal for the first loop. This first path is connected to a second loop, and is coupled to a pilot signal receiver 144 via a first loop output sampler 140 and switch 142. The second output path leads to first carrier detector 136 and a first dump load 138.

In the second loop, the output of splitter 105 is delayed via delay 152 and coupled with the output of the first loop via a second interloop coupler 155. A first output path of coupler 155 is delayed by delay 156. The second path is gain and phase adjusted via gain/phase controller 160, and amplified by error amplifier 162. Both paths are combined at a second output combiner 165. The first output path from combiner 165 lead to the feedforward amplifier output 175, while the second path is shed via a second dump load 166. The first output path of combiner 165 is also sampled via second loop output sampler 168, the sampled signal being operationally coupled to pilot signal receiver 144 via switch 142.

The gain/phase controllers 110, 114, 132 and 160 are controlled by a first and a second loop controllers 150 and 170. The first loop controller 150 receives as an input the output from a first carrier detector 136 and pilot signal receiver 144, and controls first and second gain/phase controllers 114 and 132, respectively. The second loop controller 170 similarly receives as an input the output from second carrier detector 158 and pilot signal receiver 144, and controls third and fourth gain/phase controllers 110 and 160, respectively.

Each of the loop controllers 150 and 170 detects and controls the respective gain/phase controller 132 and 160 so as to minimize distortion in a frequency near pilot frequency signal.

Another prior art feedforward linear amplification system is disclosed in the U.S. Pat. No. 5,594,385 entitled "Ultra-linear Feedforward Amplifier with Adaptive Control and Method for Adaptive Control". FIG. 2 illustrates a feedforward linear amplifier block diagram according to the prior art disclosed in U.S. Pat. No. 5,594,385. As illustrated, the feedforward linear amplification system comprises a main amplifier, a distortion amplifier having a bandwidth substantially greater than the operational bandwidth of the main amplifier and coupled in parallel with and being phase synchronous with the main amplifier, a distortion detection circuit for detecting distortion in the output across the operational bandwidth of the main amplifier, and an adaptive controller coupled to the distortion detection circuit and which includes a distortion cancellation means for generating control signals for dynamically varying the attenuation of the signal through the distortion amplifier to cancel distortion in an output of the feedforward linear amplification system.

The above-stated prior art linear amplifiers continue to control gain and phase of error amplifiers so as to suppress the intermodulation distortion component. A pilot tone signal is injected to an input port of a main amplifier, and a pilot frequency signal determined at an output port of the linear amplifier is used to judge how much the intermodulation distortion component is suppressed. These linear amplifiers utilize a method of determining distortion suppression characteristics by controlling the gain and phase of the amplified signal amplified by an error amplifier.

In the prior art linear power amplifier, when a pilot frequency signal is inputted to an input port of the main amplifier, the pilot frequency signal is inputted while maintaining a predetermined frequency interval from an upper sideband and lower sideband of a main carrier. If a pilot frequency signal is inputted to a narrow bandwidth of operating frequency, no problems are found. However, a problem with the wide bandwidth of operating frequency, is that the gain and phase difference are not equal. So, while a signal near the pilot frequency signal has good distortion suppression characteristics, a signal far from the pilot frequency signal has poor distortion suppression characteristics.

FIG. 3 illustrates a spectrum of the signal during linear power amplification according to the prior art. a is an input signal to a linear amplifier. "a" is a signal having a harmonic component during sampling after being inputted to the linear amplifier. "b" is an output signal of power combiner 220, combined with a pilot frequency signal. "c" is an amplified signal via main amplifier 225. "d" is a carrier that is being combined with the "c" signal. "e" is an output signal mixed with "c" and "d" and via combiner 245 in which the carrier is removed and pilot frequency signal remains. "f" is a signal having the harmonic and pilot frequency removed signal via an error amplifier 265. The distorted harmonic component, however, is not completely removed.

If a feedforward error amplifier regularly maintained the gain and phase in a wide frequency band, the linear amplifier would have an ideal distortion component suppression characteristic in the entire operating frequency band. In reality, however, gain and phase are not regularly maintained. Therefore, so as to regularly cancel the distortion component in the entire operating frequency band, more pilot signal generators are required and a pilot frequency signal is required to be positioned at an upper sideband or lower sideband of the operating frequency band. Actually, however, a problem with this method is that too many hardware circuits are required.

SUMMARY OF THE INVENTION

It is an object of the present invention to provide a method and apparatus for amplifying feedforward linear power using pilot tone hopping in a feedforward linear power amplifier system which has a feedforward error amplifier obtaining regular gain in a narrow frequency bandwidth so as to maintain the intermodulation distortion suppression characteristics in a wide frequency bandwidth.

Other advantages and objects will be clear referring to the following detailed description and drawings.

According to one preferred embodiment of the present invention, a method for amplifying feedforward linear power using pilot tone hopping in a feedforward linear power amplifier system which has at least one main amplifier and regulates distortion suppression characteristics by using a pilot tone, comprises the steps of: determining an operating frequency signal for amplification from a radio frequency (RF) signal applied to the linear amplifier system; determining a pilot frequency signal from the determined operating frequency signal and hopping the decided pilot frequency signal into an upper sideband or lower sideband of an operational frequency bandwidth of the applied RF signal; and inputting the determined pilot frequency signal to an input port of a main amplifier.

The amplification method further comprises the steps of: converting a plurality of frequency signals inputted to an input port to direct current signals and searching an input frequency by using these direct current values; hopping a pilot frequency signal to an input port of a predistortion type main amplifier maintaining a predetermined interval from the searched input frequency; and inputting the pilot frequency signal in a predetermined amplitude to an intermodulation distortion component.

A feedforward linear power amplifier for suppressing intermodulation distortion component of a communication system amplifier comprises an assist amplifier for receiving input signals; a harmonic generator for receiving output signals of the assist amplifier; an assist main amplifier for receiving output signals of the harmonic generator; a pilot signal generator for generating a pilot frequency signal; a first power combiner for coupling the assist main amplifier output signal with a pilot frequency signal; a main amplifier connected to the first power combiner; a first delay circuit for delaying the main amplifier output signal for predetermined time period; a second delay circuit for delaying the assist amplifier output signal for predetermined time period; a subtraction circuit for receiving the second delay circuit output signal and the main amplifier output signal; a gain/phase controller for receiving the subtraction circuit output signal; an error amplifier for receiving the gain/phase controller output signal; a second power combiner for coupling the error amplifier output signal to the first delay circuit output signal; and a control/detect device for controlling the pilot signal generator by detecting output signal of the assist amplifier, the main amplifier, the subtraction circuit and the second power combiner.

BRIEF DESCRIPTION OF THE DRAWINGS

FIGS. 5A–G are graphical representations of the signal spectrum during linear power amplification of FIG. 4.

DETAILED DESCRIPTION OF THE INVENTION

The operating frequency signal for amplification is determined from an input signal, and a pilot frequency signal is inputted to an input port of a main amplifier. A pilot signal generator injects, in turn, two frequencies each of which is located at an upper sideband and lower sideband of the operating frequency band via a linear control device every constant time interval instead of simultaneously generating a pilot frequency signal to an upper sideband and an lower sideband of the frequency bandwidth which the main amplifier will amplify.

The amplitude of the pilot frequency signal sent from an output port is checked from the determined direct current value by a control/detect device, and a variable gain/phase controller is continuously controlled so as to reduce the direct current value.

Figure 1:
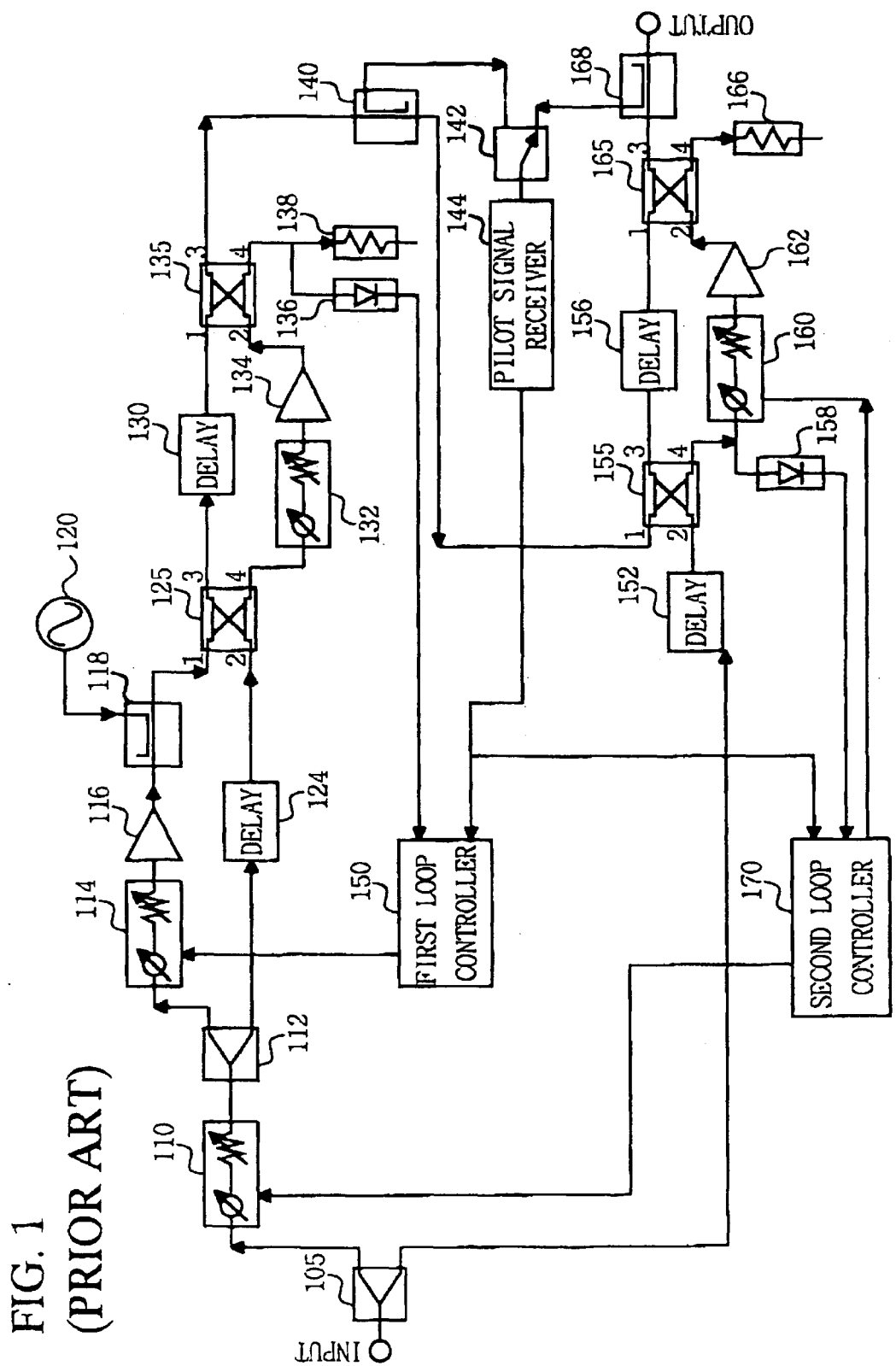
FIG. 1 illustrates a block diagram of a prior art feedforward linear amplifier.
Figure 2:
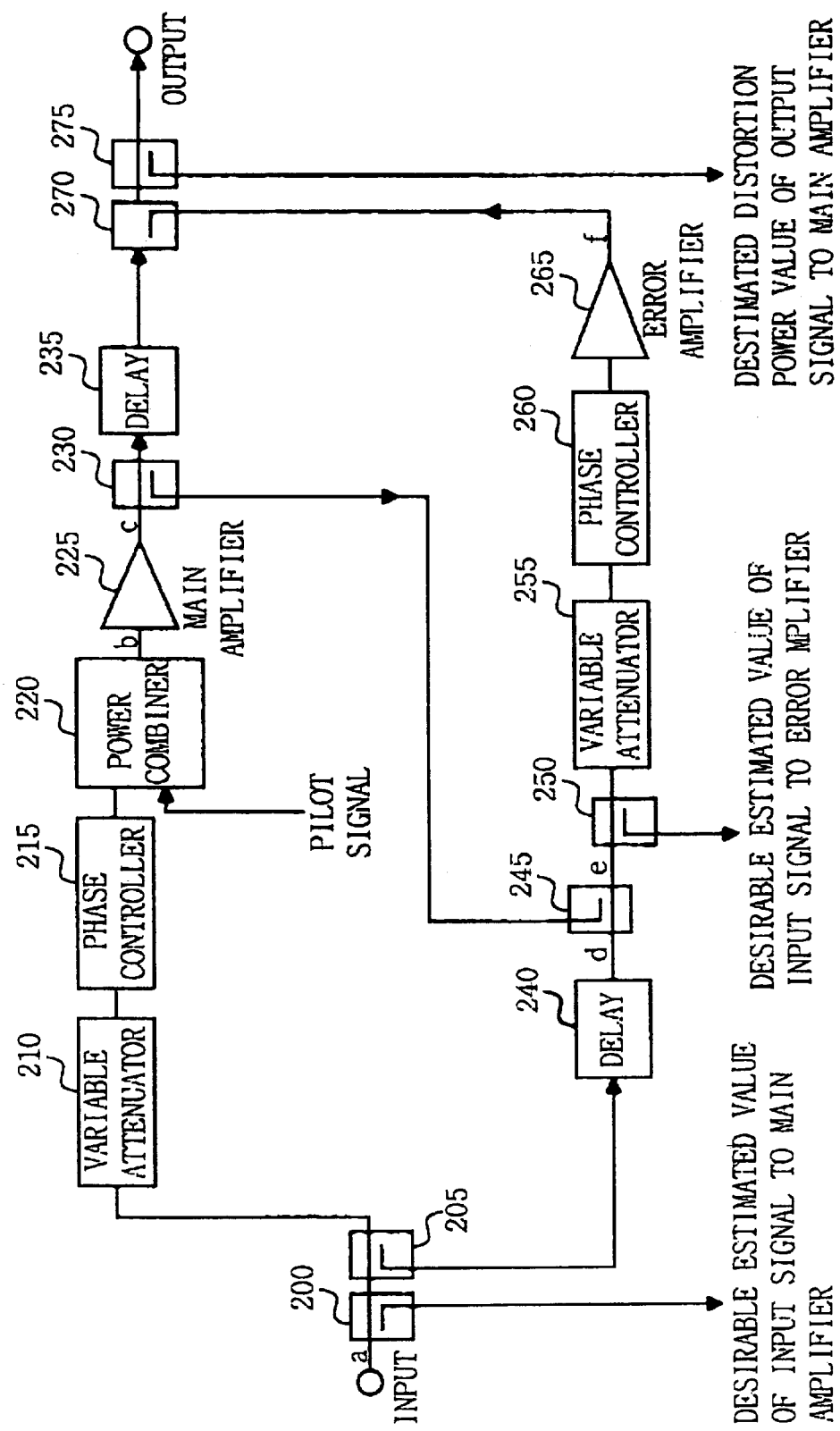
FIG. 2 illustrates a block diagram of another prior art feedforward linear amplifier.
Figure 3:
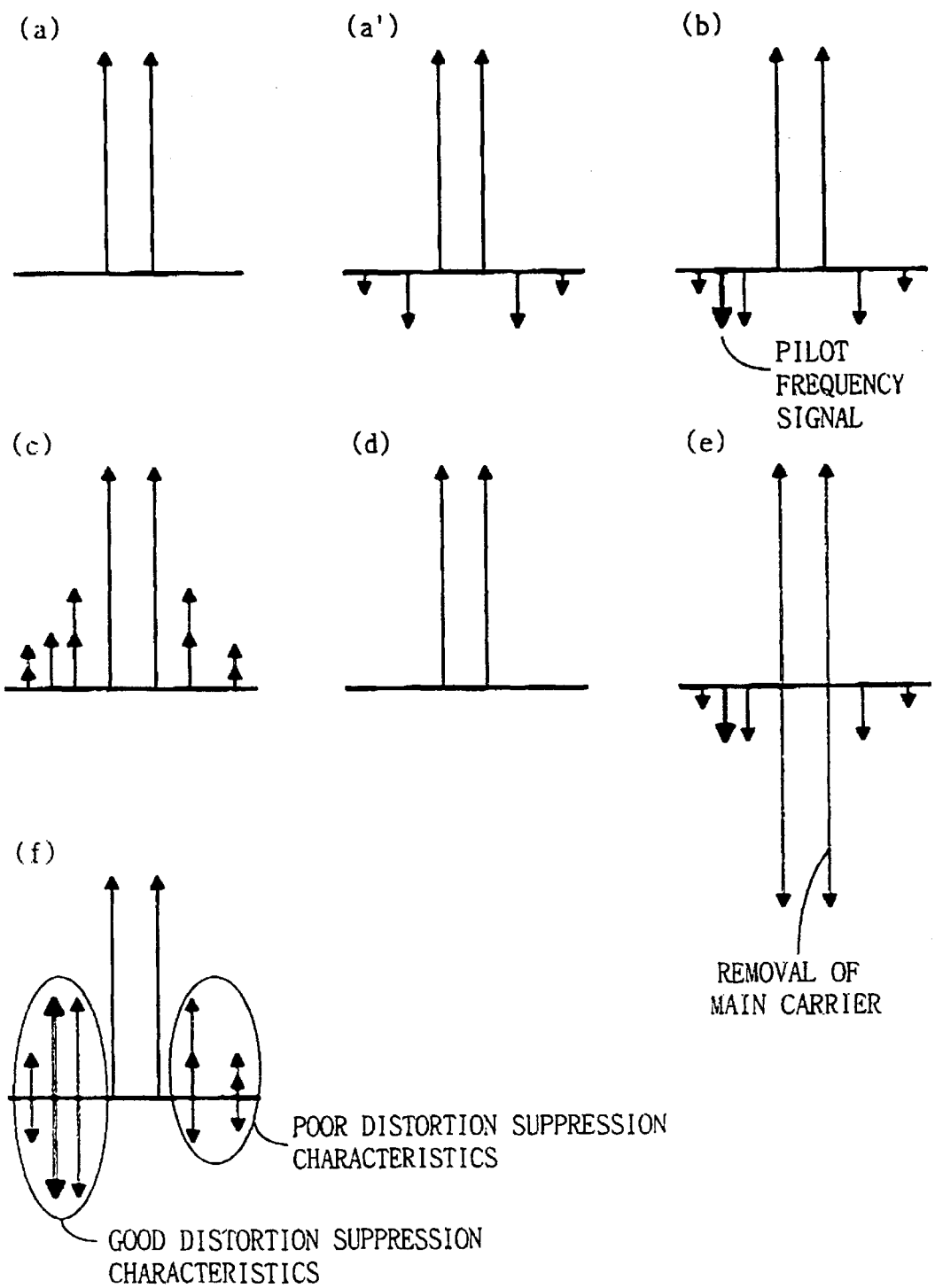
FIG. 3 illustrates spectrum of signal during linear power amplification of FIG. 2.
Figure 4:
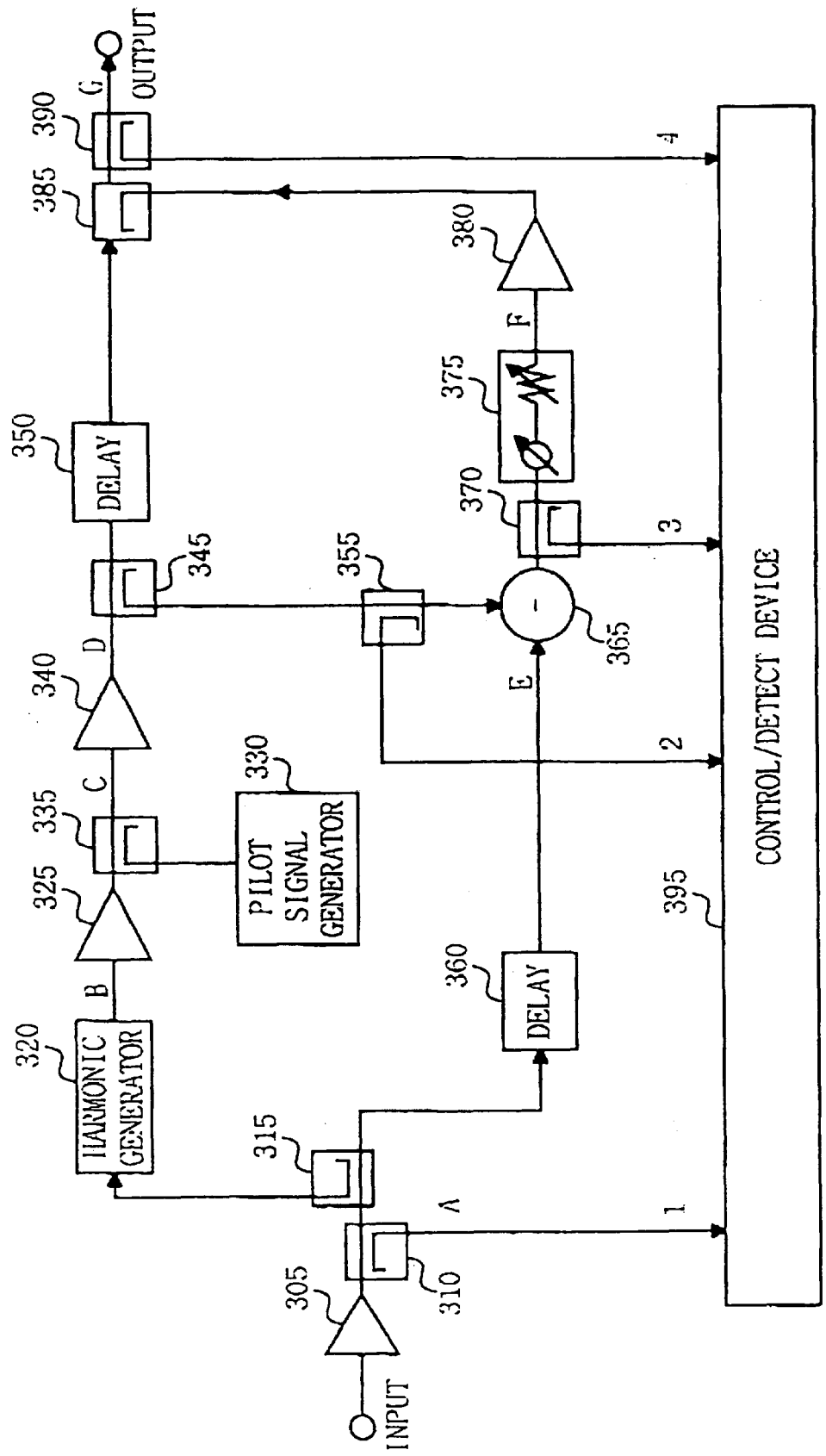
FIG. 4 is a block diagram of the feedforward linear amplifier according to embodiment of the present invention.

FIG. 4 illustrates a block diagram of a preferred embodiment of the feedforward linear amplifier, and FIG. 5 shows the signal spectrum during linear power amplification using the circuit of FIG. 4. One preferred embodiment of the present invention is described in detail.

A control/detect device 395 of FIG. 4 checks an input RF signal and detects only the signal having a frequency for amplification. The input signal is amplified by an assistant amplifier 305 and sampled via sampler 310. The sampler 310 provides the sampled signal "A" to control/detect device 395 via port 1. The control/detect device 395 removes other signals beyond the scope of the frequency (i.e., outside the operating bandwidth) from the signal which is provided via port 1 and produces a firstly-converted signal. The firstly-converted signal is synthesized with a local oscillator frequency signal into an intermediate frequency (IF) signal. The IF signal is converted into a received signal strength indicator (RSSI) direct current signal in order to measure strength of the input signal.

The control/detect device 395 determines the signal with the appropriate frequency for amplification by using the determined direct current value, and finds from the signal with frequency, a pilot value, which is input to a coupler 335. A pilot signal generator 330 generates a signal having the determined value of frequency. The pilot frequency signal generated by the pilot signal generator 330 is inputted into the coupler 335 at every constant interval.

The input signal, which is amplified by the assistant amplifier 305 is split into a first and second signal path via splitter 315. The signal on the first signal path from the splitter 315 is passed via a harmonic generator 320 and via assistant main amplifier 325 and is inputted into coupler 335 where it is coupled with the pilot frequency signal, which is inputted into coupler 335 by pilot signal generator 330 at every constant time interval.

An output signal of the coupler 335 is shown in "C" of FIG. 5. As shown, the pilot frequency signal is hopped into both sides of a main carrier and inputted. An output signal of coupler 335 is amplified via a main amplifier 340 and the amplified signal is provided to a subtraction circuit 365 via splitter 345.

The signal on the second signal path from splitter 315 is delayed via delay 360 and input into subtraction circuit 365 where all but the intermodulation distortion component is removed from the signal.

In FIG. 5, "D" is an output signal of main amplifier 340 and "E" is an output signal of delay 360. Both signals (i.e., "D" and "E") are subtracted via the subtraction circuit 365.

The subtraction circuit 365 output signal which is the remaining intermodulation distortion component is gain and phase adjusted by gain/phase controller 375 and is equally amplified by an error amplifier 380. This is the reason why a coupler sufficiently suppresses intermodulation distortion component which is not sufficiently suppressed by predistortion method.

Control/detect device 395 of FIG. 4 continues to store signals inputted via ports 1, 2, 3 and 4 and uses these signals as basic data to exactly check the phases and amplitudes of two signals. A direct current value converted from the input frequency signal is used as data to control the gain/phase controller 375. RSSI direct current value per each pilot tone frequency is read and the gain/phase controller 375 is continuously controlled to reduce the RSSI direct current value.

A final output signal of a linear power amplifier according to the present invention is shown in "G" of FIG. 5. As shown, even though an error amplifier 380 of the feedforward linear power amplifier is not ideal, distortion component suppression characteristics can be obtained evenly in the entire operation frequency bandwidth.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention. All such changes and modifications are intended to be included within the scope of the invention as defined by the appended claims.

One typical advantage of the present invention is that distortion component suppression characteristics in the wide operating frequency bandwidth are obtained by only one pilot signal generator and use of a control/detect device leads to simplicity of the circuit.

What is claimed is:

1. A method for amplifying feedforward linear power using pilot tone hopping in a feedforward linear power amplifier system which has at least one main amplifier and regulates distortion suppression characteristics by using a pilot tone, said method comprising the steps of:

determining an operating frequency signal for amplification from a radio frequency (RF) signal applied to said linear power amplifier system;

determining a pilot frequency signal from said determined operating frequency signal; and hopping said determined pilot frequency signal into an upper sideband or lower sideband of an operational frequency bandwidth of said applied RF signal and inputting said determined pilot frequency signal to an input port of the at least one main amplifier.

2. The method as set forth in claim 1, wherein said step of determining an operating frequency signal further comprises the steps of:

converting said applied RF signal into a first intermediate frequency (IF) signal;

converting said converted first IF signal into a second IF signal;

converting said converted second IF signal into a direct current signal; and determining an operating frequency signal for amplification using said direct current signal.

3. The method as set forth in claim 2, wherein said step of converting said applied RF signal into a first IF signal further comprises the step of filtering said applied RF signal through a band-pass filter.

4. The method as set forth in claim 2, wherein said step of converting said applied RF signal into a first IF signal synthesizes said applied RF signal and a local oscillator frequency signal supplied from a frequency synthesizer into said first IF signal.

5. The method as set forth in claim 2, wherein said step of converting said converted first IF signal into a second IF signal uses a frequency modulation IF integrated circuit (FM IF IC) for said conversion.

6. The method as set forth in claim 5, wherein said FM IF IC includes a received signal strength indicator (RSSI).

7. The method as set forth in claim 6, wherein in said step of converting said converted second IF signal into a direct current signal, said received signal strength indicator (RSSI) included in said FM IF IC is used for said conversion.

8. The method as set forth in claim 2, wherein said determined operating frequency signal serves as basic data for controlling a variable attenuator and a variable phase-shifter of said feedforward linear power amplifier.

9. The method as set forth in claim 8, wherein distortion component suppression characteristics are obtained evenly in said entire operating frequency bandwidth by adjusting said variable attenuator and variable phase-shifter in order to decrease each of said direct current values at the same time subsequent to reading direct current values pursuant to each of pilot frequencies hopped into the upper or lower sideband.

10. The method as set forth in claim 1, wherein said step of determining a pilot frequency signal determines a program pilot frequency signal by a program, based on said determined operating frequency signal for amplification.

11. The method as set forth in claim 1, wherein said step of inputting said determined pilot frequency signal further comprises the step of inputting the determined pilot frequency signal into an input port of a predistortion type main amplifier.

12. The method as set forth in claim 1, wherein in said step of inputting said determined pilot frequency signal, said decided pilot frequency signal is inputted into an upper sideband or lower sideband of said operating frequency bandwidth at constant time interval.

13. The method as set forth in claim 1, wherein said step of hopping and inputting maintains a degree of suppressing intermodulation distortion component of linear amplifier in said entire operating frequency bandwidth.

14. A method for amplifying feedforward linear power using pilot tone hopping in a feedforward linear power amplifier system which has at least one main amplifier and regulates distortion suppression characteristics by using a pilot tone, comprising the steps of:

converting a plurality of input frequency signals to direct current signals and searching an input frequency by using these direct current values; and hopping a pilot frequency signal to an input port of a predistortion type main amplifier maintaining a predetermined interval from said searched input frequency and inputting said pilot frequency signal at a predetermined amplitude to an intermodulation distortion component.

15. A feedforward linear power amplifier for suppressing intermodulation distortion component of a communication system amplifier, comprising:

an assist amplifier for receiving input signals;

a harmonic generator for receiving output signals of said assist amplifier;

an assist main amplifier for receiving output signals of said harmonic generator;

a pilot signal generator for generating a pilot frequency signal;

a first power combiner for coupling an output signal of said assist main amplifier with the pilot frequency signal;

a main amplifier connected to said first power combiner;

a first delay circuit for delaying an output signal of said main amplifier for a predetermined time period;

a second delay circuit for delaying said output signal of said assist amplifier for a predetermined time period;

a subtraction circuit for receiving an output signal of said second delay circuit and said main amplifier;

a gain/phase controller for receiving an output signal of said subtraction circuit;

an error amplifier for receiving an output signal of said gain/phase controller;

a second power combiner for coupling an output signal of said error amplifier output to an output signal of said first delay circuit; and a control/detect device for controlling said pilot signal generator by detecting the output signal of said assist amplifier, said main amplifier, said subtraction circuit and said second power combiner.

16. The feedforward linear power amplifier as set forth in claim 15, wherein said pilot tone is hopped outside the operating frequency bandwidth.

* * * * *